(12) United States Patent
Oh et al.

(10) Patent No.: US 9,583,552 B2
(45) Date of Patent: Feb. 28, 2017

(54) ORGANIC LIGHT EMITTING DIODE DISPLAY

(71) Applicant: Samsung Display Co., Ltd., Yongin, Gyeonggi-do (KR)

(72) Inventors: Jae Hwan Oh, Cheonan-si (KR); Hwa Jin Noh, Hwaseong-si (KR); Se Hun Park, Asan-si (KR); Won Kyu Lee, Seoul (KR); Young-Jin Chang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 216 days.

(21) Appl. No.: 14/495,677

(22) Filed: Sep. 24, 2014

(65) Prior Publication Data
US 2015/0270327 A1    Sep. 24, 2015

(30) Foreign Application Priority Data

Mar. 18, 2014   (KR) .................. 10-2014-0031852

(51) Int. Cl.
    *H01L 27/32*   (2006.01)
    *H01L 51/52*   (2006.01)

(52) U.S. Cl.
    CPC ...... *H01L 27/3279* (2013.01); *H01L 27/3223* (2013.01); *H01L 27/3248* (2013.01); *H01L 51/5209* (2013.01); *H01L 27/3276* (2013.01)

(58) Field of Classification Search
    None
    See application file for complete search history.

(56) References Cited

U.S. PATENT DOCUMENTS

| 7,663,147 B2* | 2/2010 | Jung | H01L 51/5088 |
| | | | 257/59 |
| 2005/0285509 A1* | 12/2005 | Funamoto | H01L 51/5209 |
| | | | 313/504 |

(Continued)

FOREIGN PATENT DOCUMENTS

| JP | 2006-294364 | 10/2006 |
| KR | 10-0412124 B1 | 12/2003 |

(Continued)

OTHER PUBLICATIONS

EPO Search Report dated Aug. 11, 2015, for corresponding European Patent application 14186260.7, (8 pages).

*Primary Examiner* — Ashok Patel
(74) *Attorney, Agent, or Firm* — Lewis Roca Rothgerber Christie LLP

(57) ABSTRACT

An organic light emitting diode display includes a substrate; a gate wire on the substrate; an interlayer insulating layer covering the gate wire; a data wire on the interlayer insulating layer; a passivation layer on the data wire and the interlayer insulating layer and having a protection opening; a pixel electrode on a first wiring portion of the data wire exposed through the protection opening and the interlayer insulating layer; a pixel definition layer on the passivation layer and having a pixel opening exposing the pixel electrode; an organic emission layer covering the pixel electrode; and a common electrode covering the organic emission layer and the pixel definition layer, wherein the pixel electrode contacting the first wiring portion of the data wire and the interlayer insulating layer has protrusions and depressions.

9 Claims, 4 Drawing Sheets

(56) References Cited

U.S. PATENT DOCUMENTS

| | | | |
|---|---|---|---|
| 2007/0008461 A1* | 1/2007 | Kobayashi | G02F 1/133514 |
| | | | 349/106 |
| 2011/0198598 A1 | 8/2011 | Kim et al. | |
| 2011/0248309 A1 | 10/2011 | Han et al. | |
| 2011/0285691 A1 | 11/2011 | Takasugi et al. | |
| 2014/0346484 A1 | 11/2014 | Nendai et al. | |
| 2015/0069361 A1* | 3/2015 | Sato | H01L 51/0015 |
| | | | 257/40 |

FOREIGN PATENT DOCUMENTS

| | | |
|---|---|---|
| KR | 10-0983704 B1 | 9/2010 |
| KR | 10-2013-0016937 A | 2/2013 |
| KR | 10-1293561 B1 | 8/2013 |
| WO | WO 2013/080490 A1 | 6/2013 |

\* cited by examiner

ORGANIC LIGHT EMITTING DIODE DISPLAY

CROSS-REFERENCE TO RELATED APPLICATION

This application claims priority to and the benefit of Korean Patent Application No. 10-2014-0031852 filed in the Korean Intellectual Property Office on Mar. 18, 2014, the entire contents of which are incorporated herein by reference.

BACKGROUND

1. Field

The described technology relates generally to an organic light emitting diode display.

2. Description of the Related Art

An organic light emitting diode display includes two electrodes of an anode and a cathode, and an organic light emitting layer located between the two electrodes. The anode injects holes and the cathode injects electrons into the light emitting layer. The injected electrons and holes are combined to form excitons and the excitons emit light as they discharge energy.

Such an organic light emitting diode display includes a plurality of pixels including an organic light emitting diode, which is a self-emission device, wherein a plurality of thin film transistors and storage capacitors for driving the organic light emitting diode are located in each pixel.

To improve a viewing angle of the organic light emitting diode display, protrusions and depressions are formed at a passivation layer made of an organic layer. Also, for application to a larger TV, in the large organic light emitting diode display, a thickness of the passivation layer is increased to minimize parasitic capacitance between the data wire and the cathode.

However, when forming the protrusions and depressions at the thick passivation layer of the large organic light emitting diode display, by applying a half tone photomask to a pad portion, the protrusions and depressions are formed and simultaneously the thickness of the passivation layer must be reduced in the pad portion to perform pad bonding. Alternatively, a separate mask from the mask to form the pad portion must be added to form the protrusions and depressions in the passivation layer of the pixel.

The above information disclosed in this Background section is only for enhancement of understanding of the background of the described technology and therefore it may contain information that does not form the prior art that is already in this country to a person of ordinary skill in the art.

SUMMARY

The exemplary embodiment provides a large organic light emitting diode display with an improved viewing angle that is produced without an additional mask.

An organic light emitting diode display according to an exemplary embodiment includes: a substrate; a gate wire formed on the substrate; an interlayer insulating layer covering the gate wire; a data wire formed on the interlayer insulating layer, and including a data line for transmitting a data signal and a dummy data member insulated from the data line; a passivation layer formed on the data wire and the interlayer insulating layer and having a protection opening; a pixel electrode formed on a first wiring portion of the data wire exposed through the protection opening and the interlayer insulating layer; a pixel definition layer formed on the passivation layer and having a pixel opening exposing the pixel electrode; an organic emission layer covering the pixel electrode; and a common electrode covering the organic emission layer and the pixel definition layer, wherein the first wiring portion of the data wire includes the dummy data member, and wherein the pixel electrode contacting the first wiring portion of the data wire and the interlayer insulating layer has protrusions and depressions.

The pixel electrode may include a convex pixel portion contacting the first wiring portion of the data wire and a concave pixel portion contacting the interlayer insulating layer.

An auxiliary electrode formed on the passivation layer and separated from the pixel electrode may be further included, and the auxiliary electrode may contact the common electrode.

The pixel definition layer may have an assistance opening exposing the auxiliary electrode, and the common electrode may contact the auxiliary electrode through the assistance opening.

The data wire may include a second wiring portion insulated from the data line, and the auxiliary electrode may be connected to the second wiring portion of the data wire through the contact hole formed in the passivation layer.

The auxiliary electrode may be formed of the same material as the pixel electrode.

The gate wire may include a first storage electrode overlapping the second wiring portion of the data wire, and the second wiring portion of the data wire may be a second storage electrode.

The data wire may further include: a driving voltage line transmitting a driving voltage, a compensation control line transmitting a compensation control signal and crossing the scan line, an operation control line crossing the scan line and transmitting an operation control signal, and a reset control line crossing the scan line and transmitting a reset signal.

The gate wire may further include a scan line transmitting a scan signal, and a switching thin film transistor connected to the scan line and the data line, a compensation thin film transistor connected to the compensation control line, an operation control thin film transistor connected to the operation control line and the switching thin film transistor, and a driving thin film transistor connected to the driving voltage line may be further included.

According to the exemplary embodiment, the pixel electrode contacts the first wiring portion of the data wire to form the protrusions and depressions at the pixel electrode such that the viewing angle may be improved.

Also, the viewing angle may be improved without the additional mask such that the manufacturing cost may be reduced and the manufacturing time may be reduced.

Further, the thickness of the first wiring portion of the data wire is increased to increase the angle of the protrusions and depressions of the pixel electrode such that the viewing angle may be further improved.

DETAILED DESCRIPTION

Figure 1:
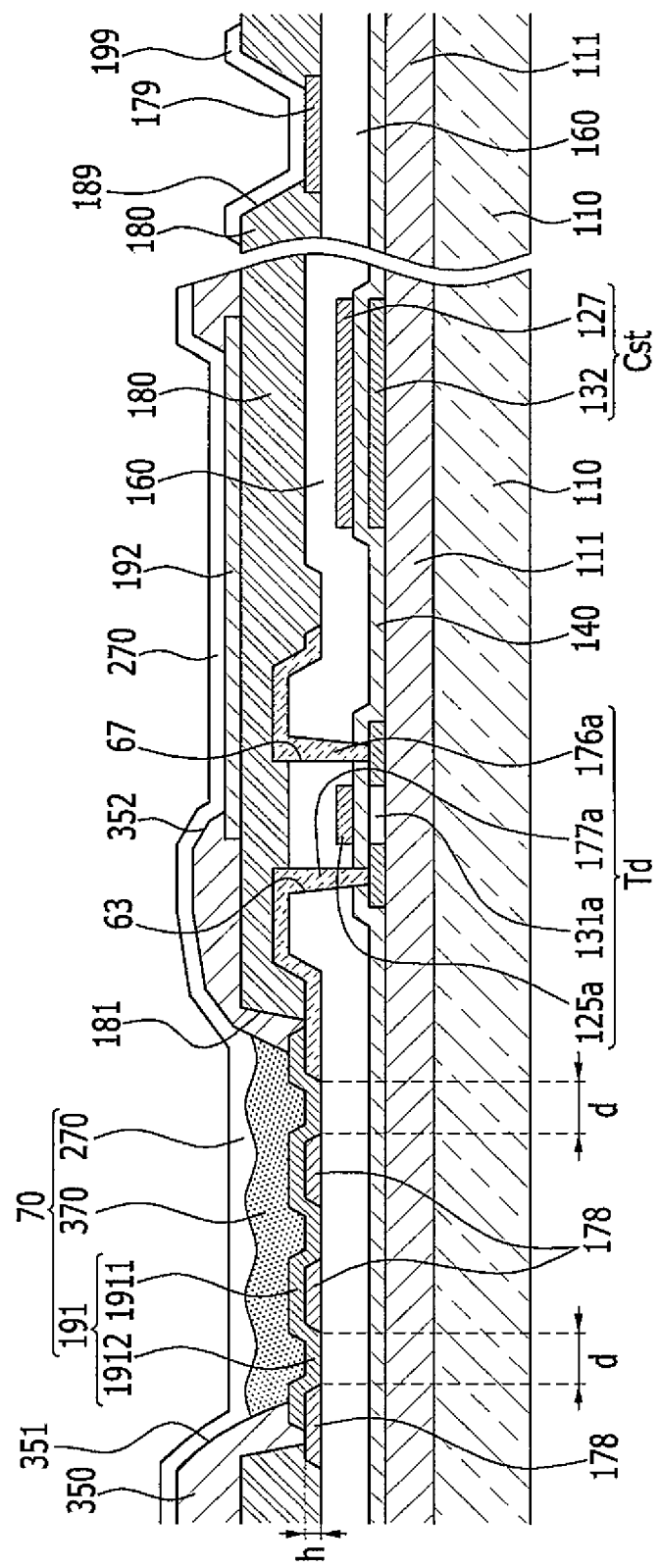
FIG. 1 is a cross-sectional view of an organic light emitting diode display according to an exemplary embodiment.

The exemplary embodiment will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the present invention is not limited thereto.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it can be directly on the other element or intervening elements may also be present.

An organic light emitting diode display according to an exemplary embodiment will be described with reference to FIG. 1.

FIG. 1 is a cross-sectional view of an organic light emitting diode display according to an exemplary embodiment.

As shown in FIG. 1, in the organic light emitting diode display according to an exemplary embodiment, a buffer layer 111 is formed on a substrate 110, and a driving semiconductor layer 131a and a first storage electrode 132 forming a storage capacitor Cst are formed on the buffer layer 111. The substrate 110 may include an insulation substrate made of glass, quartz, a ceramic material, or a plastic material.

A gate insulating layer 140 made of a silicon nitride (SiNx) or a silicon oxide ($SiO_x$) is formed on the driving semiconductor layer 131a and the first storage electrode 132.

A gate wire including a driving gate electrode 125a and a second storage electrode 127 is formed on the gate insulating layer 140. The storage capacitor Cst includes the first storage electrode 132 and the second storage electrode 127 disposed via the gate insulating layer 140 located therebetween. In one embodiment, the gate insulating layer 140 becomes a dielectric material, and a storage capacitance is determined by a charge charged to the storage capacitor Cst and a voltage between both electrodes 132 and 127.

An interlayer insulating layer 160 covering the driving gate electrode 125a and the second storage electrode 127 is formed on the gate insulating layer 140. The gate insulating layer 140 and the interlayer insulating layer 160 together have a contact hole 63 exposing a drain region of the driving semiconductor layer 131a. The interlayer insulating layer 160 is made by using a ceramic-based material such as a silicon nitride (SiNx) or a silicon oxide ($SiO_x$), like the gate insulating layer 140.

A data wire including a data line 171, a driving source electrode 176a, a driving drain electrode 177a, a dummy data member 178, and a data pad portion 179 is formed on the interlayer insulating layer 160. In this case, the driving source electrode 176a and the driving drain electrode 177a are respectively connected to a source region and a drain region of the driving semiconductor layer 131a through contact holes 67 and 63 formed in the interlayer insulating layer 160 and the gate insulating layer 140. The driving thin film transistor Td includes the driving semiconductor layer 131a, the driving gate electrode 125a, the driving source electrode 176a, and the driving drain electrode 177a.

A passivation layer 180 is formed on the interlayer insulating layer 160, and the passivation layer 180 has a protection opening 181. Among the data wire portions 171, 176a, 177a, 178, and 179, the first wiring portions 178 are exposed through the protection opening 181. The first wiring portions 178 exposed through the protection opening 181 may include the plurality of the dummy data members 178 insulated from the data line 171. The dummy data members 178 are separated from each other by an interval d, and expose the interlayer insulating layer 160 through the interval d.

A pixel electrode 191 is formed on the first wiring portions 178 exposed by the protection opening 181 and the interlayer insulating layer 160. The pixel electrode 191 contacting the first wiring portions 178 and the interlayer insulating layer 160 has a protrusions and depressions (i.e., it has a contoured or uneven surface). The pixel electrode 191 includes a convex pixel portion 1911 contacting the first wiring portions 178, and a concave pixel portion 1912 contacting the interlayer insulating layer 160. The concave pixel portion 1912 contacts the interlayer insulating layer 160 and the convex pixel portion 1911 is positioned to be higher than (i.e., not coplanar with) the concave pixel portion 1912 by a thickness h of the first wiring portions 178, and thereby the pixel electrode 191 has the protrusions and depressions.

A pixel definition layer 350 having a pixel opening 351 exposing the pixel electrode 191 is formed on the passivation layer 180. An organic emission layer 370 is formed on the pixel electrode 191 exposed through the pixel opening 351, and a common electrode 270 is formed on the organic emission layer 370 and the pixel definition layer. Accordingly, an organic light emitting diode 70 including the pixel electrode 191, the organic emission layer 370, and the common electrode 270 is formed.

In one embodiment, the pixel electrode 191 may be formed of a metal having high reflectance, and the common electrode 270 may be made of a transparent conductor such as ITO or IZO for top emission. The pixel electrode 191 is an anode as a hole injection electrode, and the common electrode 270 is a cathode as an electron injection electrode. However, an exemplary embodiment according to the present invention is not limited thereto, and according to a driving method of the organic light emitting diode display, the pixel electrode 191 may be the cathode and the common electrode 270 may be the anode. The hole and the electron are injected into the organic emission layer 370 from the pixel electrode 191 and the common electrode 270, respectively, and an exciton generated by coupling the injected hole and electron falls from an excited state to a ground state to emit light.

As described above, the pixel electrode contacts the first wiring portion to form the protrusions and depressions in the pixel electrode, and thereby the emitted light generates the diffused reflection on the protrusions and depressions of the pixel electrode such that the viewing angle may be improved.

Also, by increasing the thickness of the first wiring portion, an angle of the protrusions and depressions of the pixel electrode is increased such that the viewing angle may be further improved.

Further, the protrusions and depressions are not formed at the surface of the passivation layer to improve the viewing angle such that a separate mask to form the protrusions and depressions at the passivation layer may be omitted, thereby reducing manufacturing cost and manufacturing time.

In one embodiment, an auxiliary electrode 192 may be formed at a position separated from the pixel electrode 191 on the passivation layer 180. The pixel definition layer 350 has an assistance opening 352 exposing the auxiliary electrode 192, and the auxiliary electrode 192 contacts the common electrode 270 through the assistance opening 352.

When the organic light emitting diode display is applied to a large TV, the common electrode 270 is also typically large. Thereby a stain may be easily generated by a voltage drop in the large common electrode 270. Accordingly, to prevent the voltage drop of the common electrode 270, the common electrode 270 contacts the auxiliary electrode 192 made of a lower resistance material and a current also flows to the auxiliary electrode 192, thereby reducing the resistance.

The passivation layer 180 has a pad opening 189 exposing the data pad 179, and an assistance pad 199 made of the same material as the pixel electrode 191 is formed on the data pad 179 to protect the data pad 179.

Another exemplary embodiment of applying the pixel electrode having the protrusions and depressions of an exemplary embodiment to an organic light emitting diode display having a compensation circuit is possible. An organic light emitting diode display according to another exemplary embodiment will be described with reference to FIG. 2.

Figure 2:
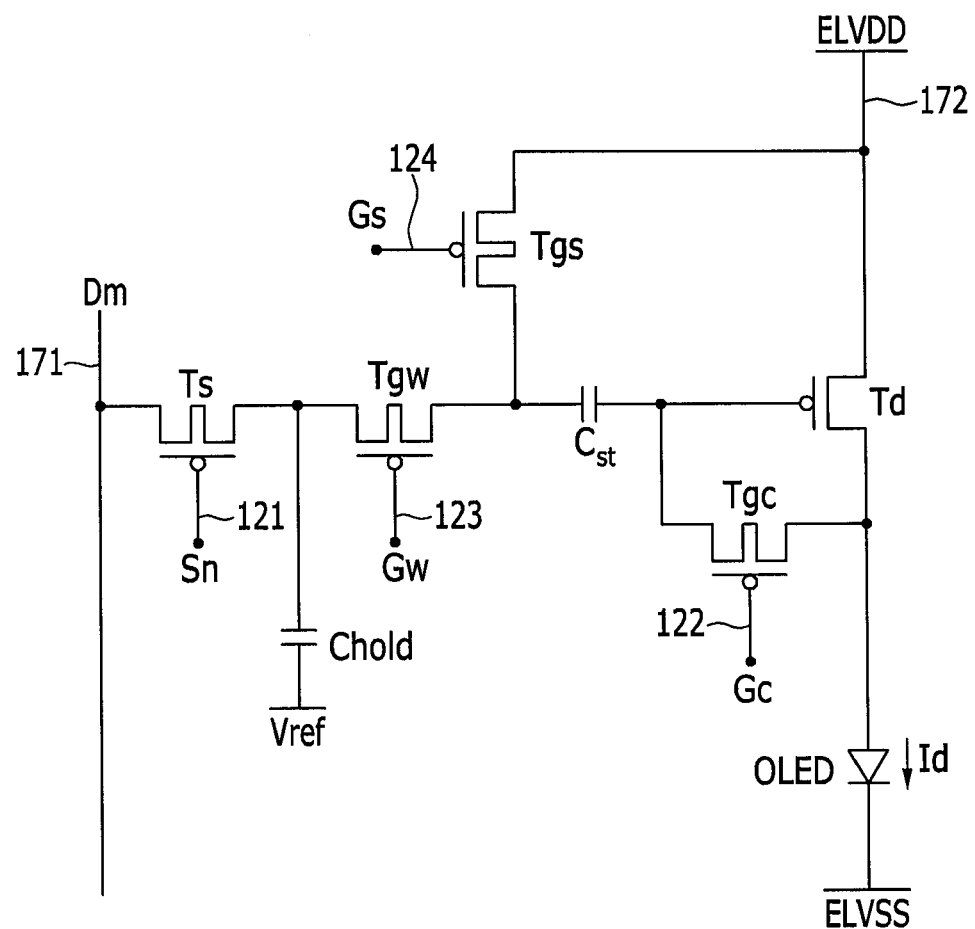
FIG. 2 is an equivalent circuit diagram of one pixel of an organic light emitting diode display according to another exemplary embodiment.

FIG. 2 is an equivalent circuit diagram of one pixel of an organic light emitting diode display according to another exemplary embodiment.

As shown in FIG. 2, one pixel of the organic light emitting diode display according to another exemplary embodiment includes a plurality of signal lines 121, 122, 123, 124, 171, and 172, a plurality of thin film transistors Td, Ts, Tgc, Tgs, and Tgw connected to a plurality of signal lines, a plurality of capacitors Cst and Chold, and an organic light emitting diode (OLED).

The plurality of thin film transistors includes a driving thin film transistor Td, a switching thin film transistor Ts, a compensation thin film transistor Tgc, a reset thin film transistor Tgs, and an operation control thin film transistor Tgw, and the plurality of capacitors Cst and Chold includes a storage capacitor Cst and a hold capacitor Chold.

The signal lines include a scan line 121 transmitting a scan signal Sn, a compensation control line 122 transmitting a compensation control signal Gc to a compensation thin film transistor Tgc, an operation control line 123 transmitting an operation control signal Gw to an operation control thin film transistor Tgw, a reset control line 124 transmitting a reset signal Gs to a reset thin film transistor Tgs, a data line 171 crossing the scan line 121 and transmitting a data signal Dm, and a driving voltage line 172 transmitting a driving voltage ELVDD to the driving thin film transistor Td.

The driving thin film transistor Td includes a gate electrode connected to one terminal of the storage capacitor Cst, a source electrode connected to the driving voltage line 172, and a drain electrode electrically connected to the organic light emitting diode (OLED).

The gate electrode of the switching thin film transistor Ts is connected to the scan line 121, the source electrode of the switching thin film transistor Ts is connected to the data line 171, the drain electrode of the switching thin film transistor Ts is connected to the other terminal of the holding capacitor Chold and the source electrode of the operation control thin film transistor Tgw. The switching thin film transistor Ts is turned on according to the scan signal Sn transferred through the scan line 121, and a scanning operation where the data signal Dm transferred from the data line 171 is programmed in the holding capacitor Chold is performed.

The gate electrode of the operation control thin film transistor Tgw is connected to the operation control line 123, the source electrode of the operation control thin film transistor Tgw is connected to the other end of the hold capacitor Chold and the drain electrode of the switching thin film transistor Ts, and the drain electrode of the operation control thin film transistor Tgw is connected to the drain electrode of the reset thin film transistor Tgs and the other terminal storage capacitor Cst.

The operation control thin film transistor Tgw is turned off while the organic light emitting diode (OLED) emits light. A data signal is programmed in the hold capacitor Chold during this period. In other words, the operation control thin film transistor Tgw electrically isolates the hold capacitor Chold and the storage capacitor Cst from each other so that the light emission and data programming operations are simultaneously performed.

The reset thin film transistor Tgs has the gate electrode connected to the reset control line 124, the source electrode connected to the driving voltage line 172, and the drain electrode connected to the other terminal of the storage capacitor Cst and the drain electrode of the operation control thin film transistor Tgw. The reset thin film transistor Tgs is turned on according to the reset control signal Gs transmitted through the reset control line 124. Thus, the voltage of the gate electrode of the driving thin film transistor Td is reset through the driving voltage line 172.

The compensation thin film transistor Tgc has the gate electrode connected to the compensation control line 122, the source electrode connected to the drain electrode of the driving thin film transistor Td and the anode of the organic light emitting diode (OLED), and the drain electrode connected to one terminal of the storage capacitor Cst. The compensation thin film transistor Tgc is turned on according to the compensation control signal Gc transmitted through the compensation control line 122 such that the gate electrode and the drain electrode of the driving thin film transistor Td are connected, thereby diode-connecting the driving thin film transistor Td.

The data voltage transferred through the turned on switching thin film transistor Ts while a scanning period of an i-th frame is programmed in the hold capacitor Chold. The operation control thin film transistor Tgw is turned on during a period from a time at which the light emitting period of the i-th frame is finished to a time at which the (i+1)-th light emitting period starts, and the data signal stored in the hold capacitor Chold is transferred to the storage capacitor Cst during a turn-on period.

An end of the storage capacitor Cst is connected to the driving voltage line 172, and a gate-source voltage of the driving transistor Td is determined according to the voltage programmed to the storage capacitor Cst. The cathode of the organic light emitting diode (OLED) is connected to a common voltage ELVSS.

The organic light emitting diode (OLED) emits light according to a driving current Id transferred from the driving voltage ELVDD through the driving thin film transistor Td, and the driving current Id flows as a common voltage ELVSS.

As described above, the organic light emitting diode display according to the exemplary embodiment is operated according to a driving method where a plurality of pixels simultaneously emit light during a present frame period according to the data voltage programmed in a prior frame and present frame data are simultaneously programmed in a plurality of pixels.

An organic light emitting diode display according to another exemplary embodiment will be described with reference to FIG. 3.

Figure 3:
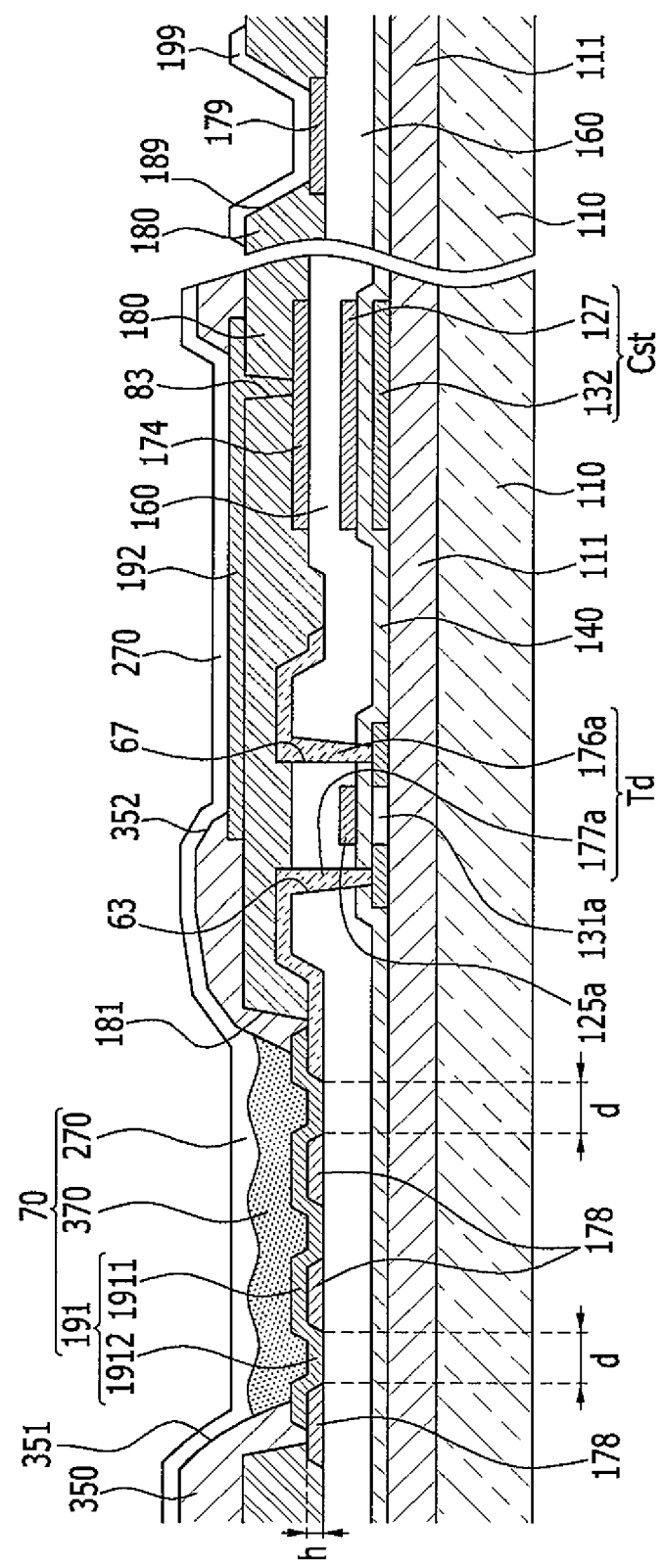
FIG. 3 is a cross-sectional view of an organic light emitting diode display according to another exemplary embodiment.

FIG. 3 is a cross-sectional view of an organic light emitting diode display according to another exemplary embodiment.

The exemplary embodiment of FIG. 3 is substantially the same as the exemplary embodiment shown in FIG. 1 except for the second wiring portion, such that the overlapping description is substantially omitted.

As shown in FIG. 3, on the interlayer insulating layer 160 of the organic light emitting diode display according to the current exemplary embodiment, the data wire including the assistance data line 174, the driving source electrode 176a, the driving drain electrode 177a, the dummy data member 178, and the data pad 179 is formed.

The passivation layer 180 is formed on the interlayer insulating layer 160, and the passivation layer 180 has the protection opening 181. The first wiring portions 178 among the data wire portions 171, 174, 176a, 177a, 178, and 179 are exposed through the protection opening 181, and a second wiring portion 174 covered by the passivation layer 180 includes an assistance data line 174.

The auxiliary electrode 192 is connected to the assistance data line 174 through a contact hole 83 formed in the passivation layer 180. The assistance data line 174 is made of the low resistance material, and the current flowing to the common electrode flows through both the auxiliary electrode 192 and assistance data line 174 such that the voltage drop of the common electrode may be prevented. Also, an area of the auxiliary electrode 192 may be reduced such that the area occupied by the auxiliary electrode 192 may be reduced, thereby improving the aperture ratio.

In the present exemplary embodiment, to further minimize the voltage drop, the second wiring portion connected to the auxiliary electrode is formed, however another exemplary embodiment of forming the storage capacitor by using the second wiring portion is possible.

Next, an organic light emitting diode display according to another exemplary embodiment will be described with reference to FIG. 4.

Figure 4:
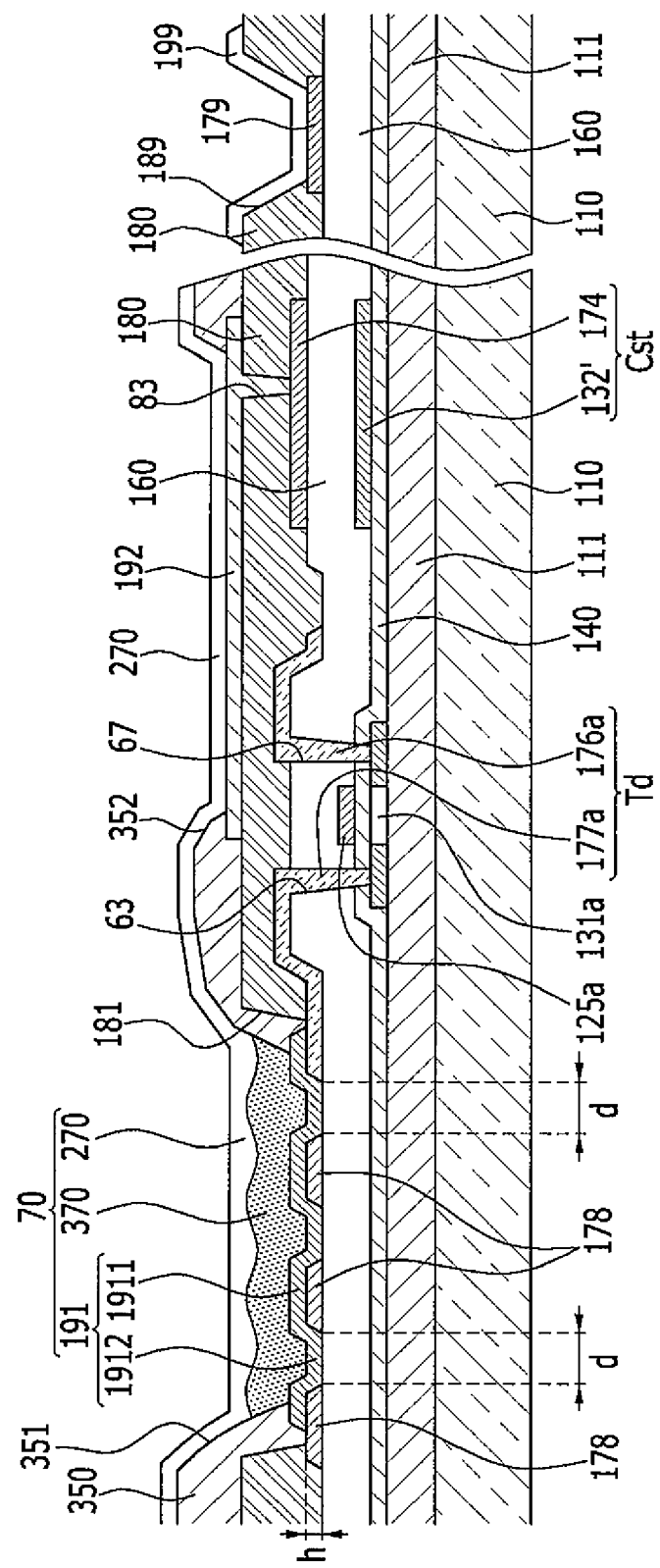
FIG. 4 is a cross-sectional view of an organic light emitting diode display according to another exemplary embodiment.

FIG. 4 is a cross-sectional view of an organic light emitting diode display according to another exemplary embodiment.

The exemplary embodiment of FIG. 4 is substantially the same as the exemplary embodiment shown in FIG. 3 except for the storage capacitor, such that the overlapping description is substantially omitted.

As shown in FIG. 4, in the organic light emitting diode display according to another exemplary embodiment, the buffer layer 111 is formed on the substrate 110, and the driving semiconductor layer 131a is formed on the buffer layer 111.

The gate insulating layer 140 made of a silicon nitride (SiNx) or a silicon oxide ($SiO_x$) is formed on the driving semiconductor layer 131a. The gate wire including the driving gate electrode 125a and the first storage electrode 132' is formed on the gate insulating layer 140.

The interlayer insulating layer 160 covering the driving gate electrode 125a and the first storage electrode 132' is formed on the gate insulating layer 140. The data wire including the data line 171, the assistance data line 174, the driving source electrode 176a, the driving drain electrode 177a, the dummy data member 178, and the data pad portion 179 is formed on the interlayer insulating layer 160.

The storage capacitor Cst includes the first storage electrode 132' and the second storage electrode 174 made of the assistance data line 174 overlapping each other via the interlayer insulating layer 160 located therebetween. In one embodiment, the interlayer insulating layer 160 becomes the dielectric material, and the storage capacitance is determined by the charge amount charged to the storage capacitor Cst and the voltage between the two electrodes 127 and 174.

As described above, the first storage electrode is formed of the gate wire by performing the storage doping to the semiconductor layer by using the separate mask without the separate formation of the first storage electrode, thereby reducing the number of masks. Thus, manufacturing time and manufacturing cost can be reduced.

The passivation layer 180 is formed on the interlayer insulating layer 160, and the passivation layer 180 has the protection opening 181. The first wiring portions 178 among the data wire portions 171, 174, 176a, 177a, 178, and 179 are exposed through the protection opening 181, and the second wiring portion 174 covered by the passivation layer 180 includes the assistance data line 174.

The auxiliary electrode 192 is connected to the assistance data line 174 through the contact hole 83 formed in the passivation layer 180. The assistance data line 174 is made of the low resistance material, and the current flowing to the common electrode flows through both the auxiliary electrode 192 and assistance data line 174 such that the voltage drop of the common electrode may be prevented. Also, the area of the auxiliary electrode may be reduced such that the aperture ratio impacted by the auxiliary electrode may be reduced, thereby improving a lifetime of the display.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| Description of Symbols | |
|---|---|
| 110: substrate | 121: scan line |
| 122: compensation control line | 123: operation control line |
| 124: reset control line | 171: data line |
| 172: driving voltage line | 178: dummy data member |
| 191: pixel electrode | 270: common electrode |
| 370: organic emission layer | |

What is claimed is:

1. An organic light emitting diode display comprising:
a substrate;
a gate wire on the substrate;

an interlayer insulating layer covering the gate wire;
a data wire on the interlayer insulating layer, and including a data line for transmitting a data signal and a dummy data member insulated from the data line;
a passivation layer on the data wire and the interlayer insulating layer and having a protection opening;
a pixel electrode on a first wiring portion of the data wire exposed through the protection opening and the interlayer insulating layer;
a pixel definition layer on the passivation layer and having a pixel opening exposing the pixel electrode;
an organic emission layer covering the pixel electrode; and
a common electrode covering the organic emission layer and the pixel definition layer,
wherein the first wiring portion of the data wire includes the dummy data member, and
wherein the pixel electrode contacting the first wiring portion of the data wire and the interlayer insulating layer has protrusions and depressions.

2. The organic light emitting diode display of claim 1, wherein the pixel electrode includes a convex pixel portion contacting the first wiring portion of the data wire and a concave pixel portion contacting the interlayer insulating layer.

3. The organic light emitting diode display of claim 1, wherein:
the data wire further comprises a driving voltage line for transmitting a driving voltage, a compensation control line for transmitting a compensation control signal and crossing the scan line, an operation control line crossing the scan line and configured to transmit an operation control signal, and a reset control line crossing the scan line and configured to transmit a reset signal.

4. The organic light emitting diode display of claim 3, wherein the gate wire further includes a scan line transmitting a scan signal, and
wherein the organic light emitting diode display further comprises: a switching thin film transistor connected to the scan line and the data line;
wherein a compensation thin film transistor is connected to the compensation control line;
wherein an operation control thin film transistor is connected to the operation control line and the switching thin film transistor; and
wherein a driving thin film transistor is connected to the driving voltage line.

5. The organic light emitting diode display of claim 1, further comprising an auxiliary electrode on the passivation layer and separated from the pixel electrode, wherein the auxiliary electrode contacts the common electrode.

6. The organic light emitting diode display of claim 1, wherein:
the pixel definition layer has an assistance opening exposing the auxiliary electrode; and
the common electrode contacts the auxiliary electrode through the assistance opening.

7. The organic light emitting diode display of claim 6, wherein:
the data wire includes a second wiring portion insulated from the data line; and
the auxiliary electrode is connected to the second wiring portion of the data wire through the contact hole in the passivation layer.

8. The organic light emitting diode display of claim 7, wherein the auxiliary electrode is formed of the same material as the pixel electrode.

9. The organic light emitting diode display of claim 7, wherein:
the gate wire includes a first storage electrode overlapping the second wiring portion of the data wire; and
the second wiring portion of the data wire is a second storage electrode.

* * * * *